United States Patent
Wright et al.

(10) Patent No.: US 10,535,784 B2
(45) Date of Patent: *Jan. 14, 2020

(54) DUAL STACK VARACTOR

(71) Applicant: Qorvo US, Inc., Greensboro, NC (US)

(72) Inventors: Peter V. Wright, Portland, OR (US); Timothy S. Henderson, Portland, OR (US)

(73) Assignee: Qorvo US, Inc., Greensboro, NC (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/901,061

(22) Filed: Feb. 21, 2018

(65) Prior Publication Data
US 2018/0182903 A1    Jun. 28, 2018

Related U.S. Application Data

(63) Continuation of application No. 14/273,316, filed on May 8, 2014, now abandoned.

(51) Int. Cl.
| | |
|---|---|
| H01L 29/93 | (2006.01) |
| H01L 29/66 | (2006.01) |
| H01L 25/07 | (2006.01) |
| H01L 27/08 | (2006.01) |
| H01L 29/20 | (2006.01) |
| H01L 29/737 | (2006.01) |

(52) U.S. Cl.
CPC .............. *H01L 29/93* (2013.01); *H01L 25/07* (2013.01); *H01L 27/0808* (2013.01); *H01L 29/20* (2013.01); *H01L 29/2003* (2013.01); *H01L 29/66174* (2013.01); *H01L 29/7371* (2013.01); *H01L 2924/0002* (2013.01)

(58) Field of Classification Search
USPC ........................................................ 257/602
See application file for complete search history.

(56) References Cited

U.S. PATENT DOCUMENTS

| | | | |
|---|---|---|---|
| 4,843,358 A | 6/1989 | Meise et al. | |
| 5,055,889 A | 10/1991 | Beall | |
| 6,559,024 B1 | 5/2003 | Boles et al. | |
| 6,727,530 B1 | 4/2004 | Feng et al. | |
(Continued)

FOREIGN PATENT DOCUMENTS

| | | |
|---|---|---|
| CN | 1108817 A | 9/1995 |
| EP | 0619613 A2 | 10/1994 |
(Continued)

OTHER PUBLICATIONS

Author Unknown, "The Nuts and Bolts of Tuning Varactors," Digi-Key Corporation, Sep. 3, 2009, 15 pages.
(Continued)

*Primary Examiner* — Nilufa Rahim
(74) *Attorney, Agent, or Firm* — Withrow & Terranova, P.L.L.C.

(57) ABSTRACT

Embodiments include apparatuses and methods related to vertically stacked varactors. Specifically two varactors may be constructed of vertically stacked layers including an anode layer, a contact layer, and a varactor layer. The two varactors may share one or more layers in common. In some embodiments the two varactors may share the anode layer in common, while in other embodiments the two varactors may share the contact layer in common.

18 Claims, 7 Drawing Sheets

(56) References Cited

U.S. PATENT DOCUMENTS

| | | | |
|---|---|---|---|
| 7,323,763 | B2 | 1/2008 | Suzuki et al. |
| 10,109,623 | B2* | 10/2018 | Wright ............... H01L 27/0808 |
| 2001/0048120 | A1 | 12/2001 | Shimawaki |
| 2001/0054748 | A1 | 12/2001 | Wikborg et al. |
| 2003/0052388 | A1 | 3/2003 | Mheen et al. |
| 2003/0102498 | A1 | 6/2003 | Braithwaite et al. |
| 2004/0155719 | A1 | 8/2004 | Suzuki et al. |
| 2005/0156194 | A1 | 7/2005 | Ohbu et al. |
| 2007/0132065 | A1 | 6/2007 | Lee et al. |
| 2008/0191260 | A1 | 8/2008 | De Vreede et al. |
| 2009/0090951 | A1 | 4/2009 | Chang |
| 2009/0134960 | A1 | 5/2009 | Larson et al. |
| 2009/0195958 | A1 | 8/2009 | Vavelidis et al. |
| 2010/0127277 | A1 | 5/2010 | Arai et al. |
| 2011/0140240 | A1 | 6/2011 | Trivedi |
| 2012/0235731 | A1 | 9/2012 | Li et al. |
| 2013/0316512 | A1 | 11/2013 | Gunawan et al. |
| 2013/0334570 | A1 | 12/2013 | Lin et al. |
| 2014/0054798 | A1 | 2/2014 | Bowles |
| 2014/0097434 | A1 | 4/2014 | Ellis-Monaghan et al. |
| 2014/0110761 | A1 | 4/2014 | Yang et al. |
| 2014/0225225 | A1 | 8/2014 | Chung |
| 2014/0273323 | A1* | 9/2014 | Kim .................... H01L 29/2003 438/47 |
| 2015/0325573 | A1 | 11/2015 | Wright et al. |
| 2016/0079444 | A1 | 3/2016 | Wright |
| 2016/0133758 | A1 | 5/2016 | Wright |
| 2016/0247800 | A1 | 8/2016 | Wright et al. |
| 2016/0329918 | A1 | 11/2016 | Wright |
| 2016/0365427 | A1 | 12/2016 | Wright |

FOREIGN PATENT DOCUMENTS

| | | |
|---|---|---|
| FR | 2321771 A1 | 3/1977 |
| KR | 20050020296 A | 3/2005 |

OTHER PUBLICATIONS

Huang, Cong et al., "A GaAs Junction Varactor With a Continuously Tunable Range of 9 : 1 and an $OIP_3$ of 57 dBm," IEEE Electron Device Letters, vol. 31, No. 2, Feb. 2010, pp. 108-110.

Kumar, Tribhuwan, "Varactor theory," SlideShare.net, Published on Dec. 21, 2013, slide 14, http://www.slideshare.net/tribhuwankumar73/varactor-theory, 2 pages.

Poole, Ian, "Varactor Abrupt & Hyperabrupt Diodes," Radio-Electronics.com, Date Accessed: Feb. 9, 2016, 5 pages, http://www.radio-electronics.com/info/data/semicond/varactor-varicap-diodes/hyperabrupt.php.

Preliminary Search Report and Written Opinion for French Patent Application No. 1553377, dated Aug. 21, 2017, 11 pages.

Non-Final Office Action for U.S. Appl. No. 15/005,235, dated Jul. 29, 2016, 13 pages.

Restriction Requirement for U.S. Appl. No. 14/273,316, dated Feb. 2, 2015, 8 pages.

Non-Final Office Action for U.S. Appl. No. 14/273,316, dated Apr. 20, 2015, 14 pages.

Final Office Action for U.S. Appl. No. 14/279,316, dated Nov. 27, 2015, 18 pages.

Non-Final Office Action for U.S. Appl. No. 14/273,316, dated Sep. 2, 2016, 14 pages.

Final Office Action for U.S. Appl. No. 14/273,316, dated Jan. 31, 2017, 17 pages.

Advisory Action for U.S. Appl. No. 14/273,316, dated Mar. 31, 2017, 3 pages.

Non-Final Office Action for U.S. Appl. No. 14/273,316, dated May 18, 2017, 20 pages.

Final Office Action for U.S. Appl. No. 14/273,316, dated Sep. 5, 2017, 21 pages.

Advisory Action for U.S. Appl. No. 14/273,316, dated Nov. 13, 2017, 2 pages.

Notice of Non-Compliant Amendment for U.S. Appl. No. 14/273,316, dated Dec. 21, 2017, 4 pages.

Non-Final Office Action for U.S. Appl. No. 14/995,329, dated Aug. 18, 2017, 12 pages.

Final Office Action for U.S. Appl. No. 14/995,329, dated Dec. 6, 2017, 14 pages.

Advisory Action for U.S. Appl. No. 14/995,329, dated Feb. 14, 2018, 3 pages.

Non-Final Office Action for U.S. Appl. No. 14/485,532, dated Nov. 9, 2015, 17 pages.

Notice of Allowance for U.S. Appl. No. 14/485,532, dated May 25, 2016, 10 pages.

Non-Final Office Action for U.S. Appl. No. 15/142,404, dated Nov. 2, 2017, 12 pages.

Final Office Action for U.S. Appl. No. 15/142,404, dated Mar. 1, 2018, 18 pages.

Non-Final Office Action for U.S. Appl. No. 15/245,468, dated May 3, 2017, 19 pages.

Notice of Allowance and Examiner-Initiated Interview Summary for U.S. Appl. No. 15/245,468, dated Sep. 14, 2017, 11 pages.

Non-Final Office Action for U.S. Appl. No. 14/273,316, dated May 17, 2018, 35 pages.

Non-Final Office Action for U.S. Appl. No. 14/995,329, dated Jul. 27, 2018, 24 pages.

Notice of Allowance and Examiner-Initiated Interview Summary for U.S. Appl. No. 15/142,404, dated Jun. 14, 2018, 10 pages.

Official Letter for Taiwanese Patent Application No. 104111585, dated Jul. 13, 2018, 39 pages.

Notification of the First Office Action for Chinese Patent Application No. 201510226390.9, dated Mar. 1, 2019, 21 pages.

Final Office Action for U.S. Appl. No. 14/995,329, dated Mar. 7, 2019, 23 pages.

Advisory Action for U.S. Appl. No. 14/995,329, dated May 1, 2019, 3 pages.

Non-Final Office Action for U.S. Appl. No. 14/995,329, dated Sep. 30, 2019, 22 pages.

* cited by examiner

DUAL STACK VARACTOR

PRIORITY CLAIM

The present application claims priority to U.S. patent application Ser. No. 14/273,316, filed May 8, 2014, the disclosure of which is hereby incorporated herein in its entirety.

FIELD

Embodiments of the present disclosure relate generally to the field of circuits, and more particularly to varactors.

BACKGROUND

Varactors may be diodes that act as voltage-controlled capacitors. As a control voltage across a layer of the varactor varies, the capacitance of the varactor may also vary. This variance may be called "tuning." Generally, semiconductor varactors may have a wider tuning range (i.e. capacitance variance) and lower control voltage requirements than dielectric varactors realized on materials such as barium strontium titanate (BST). However, the semiconductor varactors may typically achieve a lower capacitance per unit area than a dielectric varactor, thereby requiring a larger die area to implement a given capacitance.

Generally, a varactor may be considered a two-port device, i.e. having two input terminals and two output terminals. As such, varactors may be prone to self-modulation distortion resulting from applied radio frequency (RF) voltages. This self-modulation distortion may introduce nonlinearity into a circuit using the varactors. To reduce this nonlinearity to acceptable levels, a number of individual varactors may be coupled in series to divide the RF voltage across them. If the number of varactors in the series is n, then the die area on the circuit board required to realize a desired net capacitance may be increased by a factor of $n^2$ if the varactors are co-planar to one another. If a relatively large number of varactors is used, then this circuit may make the required die area prohibitively large for use in modern devices.

BRIEF DESCRIPTION OF THE DRAWINGS

Embodiments are illustrated by way of example and not by way of limitation in the figures of the accompanying drawings, in which like references indicate similar elements and in which.

DETAILED DESCRIPTION

Embodiments include apparatuses and methods related to vertically stacked varactors. Specifically two varactors may be constructed of vertically stacked layers including an anode layer, a contact layer, and a varactor layer. The two varactors may share one or more layers in common. In some embodiments the two varactors may share the anode layer in common, while in other embodiments the two varactors may share the contact layer in common.

Various aspects of the illustrative embodiments will be described using terms commonly employed by those skilled in the art to convey the substance of their work to others skilled in the art. However, it will be apparent to those skilled in the art that alternate embodiments may be practiced with only some of the described aspects. For purposes of explanation, specific devices and configurations are set forth in order to provide a thorough understanding of the illustrative embodiments. However, it will be apparent to one skilled in the art that alternate embodiments may be practiced without the specific details. In other instances, well-known features are omitted or simplified in order not to obscure the illustrative embodiments.

Further, various operations will be described as multiple discrete operations, in turn, in a manner that is most helpful in understanding the present disclosure; however, the order of description should not be construed as to imply that these operations are necessarily order dependent. In particular, these operations need not be performed in the order of presentation.

The phrase "in one embodiment" is used repeatedly. The phrase generally does not refer to the same embodiment; however, it may. The terms "comprising," "having," and "including" are synonymous, unless the context dictates otherwise.

In providing some clarifying context to language that may be used in connection with various embodiments, the phrases "A/B" and "A and/or B" mean (A), (B), or (A and B); and the phrase "A, B, and/or C" means (A), (B), (C), (A and B), (A and C), (B and C) or (A, B and C).

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other.

FIGS. 2-5 may depict various vertical stacks of layers which may be epitaxially deposited. The sizes, widths, or heights of the various layers are not drawn to scale, and should not be assumed to be limited to being identical to, or different from, one another unless explicitly indicated to be so in the current specification.

Figure 1:
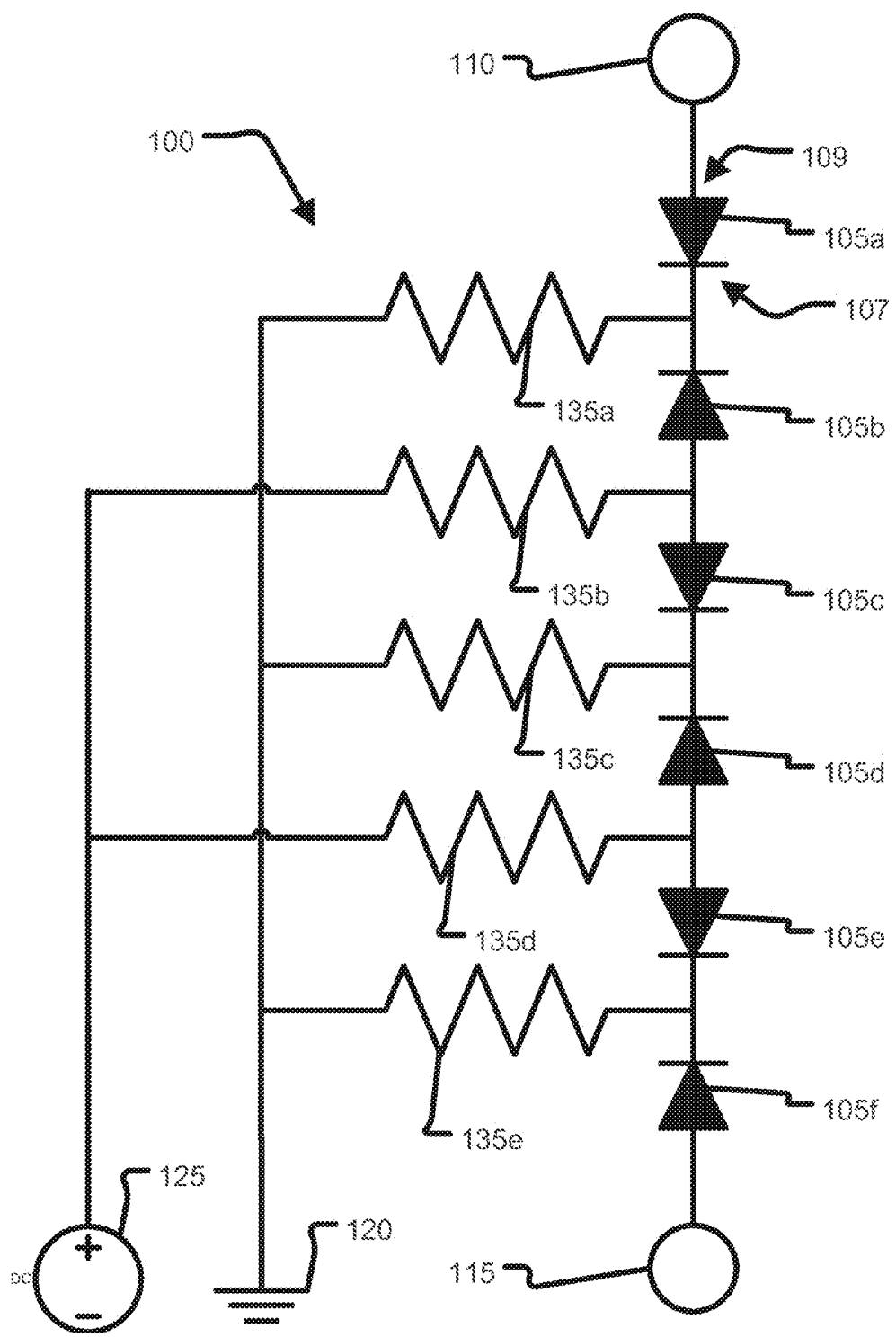
FIG. 1 illustrates an example compound varactor circuit, in accordance with various embodiments.

FIG. 1 illustrates an example circuit diagram of a compound varactor 100, in accordance with various embodiments. The compound varactor 100 may include a plurality of varactors such as varactors 105a, 105b, 105c, 105d, 105e, or 105f (collectively varactors 105) generally positioned between an input terminal 110 and an output terminal 115. In some embodiments, the input terminal 110 may be configured to receive a radio frequency (RF) signal which then propagates through the compound varactor 100 to the output terminal 115. In some embodiments, one or more of the varactors 105 may be connected in parallel with the input terminal 110 and the output terminal 115, in which case the RF signal may not propagate through the varactor to the output terminal 115.

In some embodiments, each of the varactors 105 may have a "front" side and a "back" side. FIG. 1 depicts the front side 107 and back side 109 of varactor 105a. In embodiments the front side 107 of varactor 105a may be referred to as the "cathode" of varactor 105a, and the back side 109 of varactor 105a may be referred to as the "anode" of varactor 105a. In FIG. 1, each of the varactors 105 may have a front side and a back side (or cathode and anode), though specific designators in FIG. 1 are omitted for each varactor for the sake of clarity.

In some embodiments, two or more of the varactors 105 may be coupled to one another in a back-to-back configuration. Specifically, the anodes of the varactors may be coupled directly to one another. For example, varactors 105b and 105c may be considered to be in a back-to-back configuration as shown in FIG. 1. In other embodiments, the varactors 105 may be coupled to one another in a front-to-front configuration as shown in FIG. 1. Specifically, the cathodes of the varactors may be coupled directly to one another. For example, varactors 105a and 105b may be considered to be in a front-to-front configuration as shown in FIG. 1.

In embodiments, the front sides of one or more of the varactors 105 may be coupled to ground 120. Additionally, the back sides of one or more of the varactors 105 may be coupled to a DC power source 125. The DC power source 125 may be configured to provide a negative control voltage ($V_{CTRL}$) to reverse bias the varactors 105, as will be explained in further detail below. In some embodiments, $V_{CTRL}$ may be between approximately 2 Volts (V) and approximately 18 V, while in other embodiments $V_{CTRL}$ may be between approximately −1.2 V and approximately 3 V.

In embodiments one or more resistors such as resistors 135a, 135b, 135c, 135d, and 135e (collectively resistors 135) may be positioned between the varactors 105 and the ground 120 or the DC power source 125. In some embodiments, the outer resistors such as resistors 135a and/or 135e may have a resistance up to twice the resistance of resistors 135b, 135c, or 135d. The increased resistance may be selected to equalize the charging time constant of all the capacitors in the stack.

In embodiments, the resistance of resistors 135a and/or 135e may be approximately 60 kΩ, while in other embodiments the resistance of resistors 135a and/or 135e may be between approximately 20 kΩ and approximately 60 kΩ. Similarly, in some embodiments the resistance of resistors 135b, 135c, or 135d may be approximately 30 kΩ, while in other embodiments the resistance of resistors 135b, 135c, or 135d may be between approximately 10 kΩ and approximately 30 kΩ.

As shown above, the compound varactor 100 may include a number of varactors 105 and resistors 135. Although only six varactors 105 and five resistors 135 are shown in FIG. 1, in other embodiments the compound varactor 100 may include a greater or lesser number of varactors 105 or resistors 135. In some embodiments, it may be desirable for the compound varactor to include at least the resistors 135a and 135e. In some embodiments, inductors may also be used in place of, or in combination with, the resistors 135. As discussed above, as the number of varactors 105 in the compound varactor 100 increases, the area that the compound varactor 100 requires on a die may increase exponentially if all of the varactors 105 are co-planar to one another. In some embodiments, the DC power source 125 may be configured to supply a positive $V_{CTRL}$ and be coupled to the front side, or cathode, of each of the varactors, while the ground 120 may be coupled to the back side, or anode, of each of the varactors, as discussed in further detail below. Other more complicated circuits may be envisioned having multiple DC power sources that may each supply different or similar positive or negative voltages, or multiple ground connections.

Typically, a legacy compound varactor may be implemented in common epitaxial layers of a gallium arsenide heterojunction bipolar transistor (HBT). Typically, only the lower epitaxial layers, which are commonly used for implementing the collector-base junction of an HBT, may be used for the varactors 105. This may be because the upper level epitaxial layers of the HBT may be optimized by specific doping of the layers for implementing the emitter-base bipolar junction. This doping may render the upper epitaxial layers of the HBT undesirable or unsuitable for implementing a useful varactor.

However, if a different process is used, and the requirement for a bipolar device is removed, then a more advantageous epitaxial structure may be available. Specifically, if the upper layers of an epitaxial structure are not doped to implement an emitter-base bipolar junction, then a useful varactor may be additionally implemented in the upper layers of the epitaxial structure.

Figure 2:
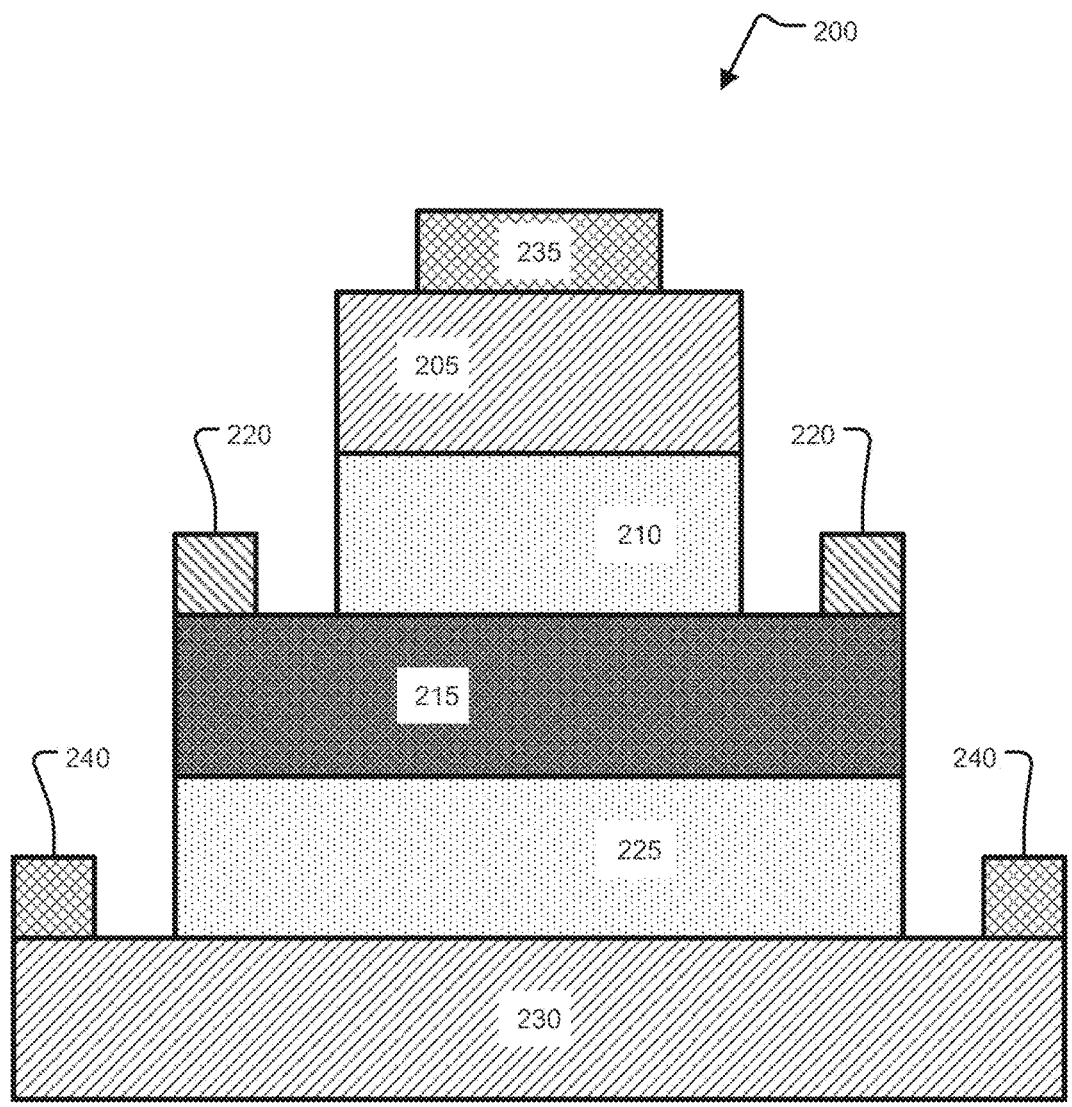
FIG. 2 illustrates a general example of a dual varactor stack, in accordance with various embodiments.

FIG. 2 illustrates a general example of a dual varactor stack 200, in accordance with various embodiments. Generally, a varactor, as discussed herein, may be considered to be made up of three layers. Specifically, a varactor may be considered to be made up of a contact layer, a varactor layer, and an anode layer. In some embodiments, the anode layer may additionally be referred to as a "contact" layer of the varactor, but for the sake of description herein the anode layer will be generally referred to as "anode layer," unless explicitly indicated otherwise. In this embodiment, the contact layer may be considered to be the cathode of the varactor. In some embodiments, a varactor may only be considered to comprise the varactor layer and the anode layer, wherein the varactor layer would be considered to be the cathode; however as discussed herein for the sake of consistency the varactor will be described as having three layers. The three layers of the varactor will be discussed in further detail below.

In embodiments, the stack 200 may include a plurality of epitaxial layers in which two varactors are implemented in a vertical, rather than co-planar, fashion. Specifically, the stack 200 may include a first varactor that is comprised of a contact layer 205, varactor layer 210, and anode layer 215 as described above. The anode layer 215 may be a p+ anode layer. The designator "p+" may indicate that the anode layer 215 is heavily doped with a positively charged impurity such as carbon, zinc, beryllium, or some other appropriate positively charged dopant. For example, the anode layer 215 may be constructed of one or more of a semiconductor material such as gallium arsenide, silicon, germanium, aluminum phosphide, aluminum arsenide, indium phosphide, gallium nitride, combinations or alloys thereof, or some other semiconductor material, with an amount of the positively charged dopant material mixed in. A p+ layer may include on the order of one atom of the positively charged dopant per ten thousand atoms of the semiconductor material. In other embodiments, the p+ anode layer may have higher than approximately $1 \times 10^{19}$ cm$^{-3}$ doping. In some embodiments, the anode layer 215 may have a vertical or z-height of between approximately 0.05 microns (μm) and approximately 0.5 μm.

Similarly, the contact layer 205 may be referred to as an n+ contact layer. The designator "n+" may indicate that the contact layer 205 is heavily doped with a negatively charged impurity such as silicon or some other appropriate negatively charged dopant. For example, the contact layer 205 may be constructed of a semiconductor material such as the semiconductor material described above with an amount of the negatively charged dopant material mixed in. An n+ layer may include on the order of one atom of the negatively charged dopant per ten thousand atoms of the semiconductor material. In other embodiments, the n+ contact layer may have higher than approximately $1\times10^{18}$ cm$^{-3}$ doping. In some embodiments, the contact layer 205 may have a vertical or z-height of between approximately 0.05 μm and 1.0 μm.

The varactor layer 210 may be referred to as an n– varactor layer. The designator "n–" may indicate that the varactor layer 210 is relatively lightly doped with a negatively charged impurity such as the negatively charged dopants described above. Specifically, an n– layer may include on the order of one atom of the negatively charged dopant per one hundred million atoms of the semiconductor material. In other embodiments, the n– varactor layer may have between approximately $1\times10^{14}$ and approximately $1\times10^{18}$ cm$^{-3}$ doping. In some embodiments, the varactor layer 210 may have a vertical or z-height of between approximately 0.2 μm and 3 μm.

The stack 200 may also include one or more p+ ohmic contacts such as ohmic contacts 220. In embodiments, the ohmic contacts 220 may be comprised of titanium (Ti), platinum (Pt), gold (Au), zinc (Zn), nickel (Ni), beryllium (Be), or combinations or alloys thereof such as Ti/Pt/Au, Pt/Au, Ti/Au, Pt/Ti/Pt/Au, AuZn/Ni/Au, AuBe/Ni/Au, or other p-type contacts. The ohmic contacts 220 may be directly coupled to the anode layer 215, and also coupled to a DC power source such as DC power source 125 of FIG. 1. In embodiments, the ohmic contacts 220 may be configured to receive a negative DC voltage that will reverse-bias the varactor. Specifically, the negative DC voltage applied to the anode layer 215 may cause the voltage at the cathode (i.e. the contact layer 205) to be higher than the voltage at the anode layer 215. This higher voltage at the cathode of the varactor may result in no current flowing through the varactor until the varactor breaks down.

The stack 200 may further include a second varactor that may be comprised of anode layer 215, varactor layer 225, and contact layer 230. Varactor layer 225 may be an n– varactor layer that may be similar to varactor layer 210. In some embodiments varactor layer 225 and varactor layer 210 may be comprised of the same material as one another, while in other embodiments the varactor layers 225 and 210 may be comprised of different materials. Similarly, the contact layer 230 may be an n+ contact layer that may be similar to contact layer 205. In some embodiments contact layer 230 and contact layer 205 may be comprised of the same material as one another, while in other embodiments the contact layers may be comprised of different materials.

The stack may further include one or more n+ ohmic contacts such as ohmic contacts 235 or 240. Specifically, the n+ ohmic contacts 235 and 240 may be coupled with the n+ contact layers 205 or 230, as shown in FIG. 2. In some embodiments. The n+ ohmic contacts 235 and 240 may be comprised of one or more of Au, germanium (Ge), Ni, Au, Ti, Pt, tungsten (W), silicon (Si), or combinations or alloys thereof such as AuGe/Ni/Au, Ti/Pt/Au, Pt/Au, Ti/Au, TiW/Ti/Pt/Au, WSi/Ti/Pt/Au, or other ohmic contacts. In some embodiments, the n+ ohmic contacts 235 and 240 may be formed of the same material or different materials from one another. In some embodiments, the ohmic contacts 235 or 240 may be topped with a different metal that is used to make contact with another device, terminal, or chip.

In embodiments, the n+ ohmic contacts 235 and 240 may be considered the input and output terminals of the stack 200. For example, one or the other of the n+ ohmic contacts 235 or 240 may be configured to receive an RF signal, for example from the input terminal 110, another varactor, or some other source. The other of the n+ ohmic contacts 235 or 240 may be configured to output an RF signal, for example to the output terminal 115, another varactor, or some other source.

As can be seen, the first varactor and the second varactor of the stack 200 may share anode layer 215. Specifically, the two varactors of stack 200 may be considered to be in a vertically stacked back-to-back configuration, as described above. As discussed above, the z-height of the anode layer 215 may be relatively small compared to the z-height of the varactor layers 210 or 225, or the z-height of the contact layers 205 or 230. This may be because the sheet resistance of layer 215 may not significantly change the performance of the stack 200.

Because it may be important that the two varactors of the stack 200 have the same or similar tuning characteristics, for example experience similar equal change in capacitance with respect to change in voltage, the epitaxial doping of the top n– varactor layer 210 may be chosen to be identical, but inverted, with respect to the doping of the lower n– varactor layer 225. These two n– varactor layers 210 and 225, which may be symmetric about their shared p+ anode layer 215, may form the depletion layers of the two varactor diodes. The two n– varactor layers 210 and 225 may also serve as the varactor capacitor dielectrics, and may be created with an abrupt, hyper abrupt, or linear doping profile. In other embodiments, one or more other doping profiles suitable to the application may also be employed.

The stack 200 may exhibit several clear advantages over previously existing compound varactors. For example, stack 200 may nearly double the effective capacitance per unit die area that can be achieved compared to previously existing compound varactor architectures. This increase in effective capacitance may result in enabling higher performance at the high degree of stacking that may be required to meet challenging intermodulation performance requirements. A specific implementation of the varactor lattice matched gallium arsenide may be described below with respect to FIGS. 4 and 5. However, in other embodiments one or more layers of the stack 200 may include silicon, indium phosphide, or other suitable materials. In embodiments, etch stop layers may be inserted to facilitate construction of the stack 200, as described in further detail below with respect to FIGS. 4 and 5.

Stack 200 may provide an additional advantage. In conventional diode stacking, such as that discussed with respect to FIG. 1, the RF signal may flow between two varactors in a back-to-back configuration via the bottom n+ contact layer. However, this n+ contact layer may typically have significant resistivity, on the order of 5 or more ohms. This resistivity may contribute to conductive losses in the varactor diode, thereby degrading the quality factor of the varactor. However, in the stack 200, the RF energy may transit directly across the relatively thin shared p+ anode layer of the two varactor diodes, and thus should suffer significantly reduced conductive losses.

Figure 3:
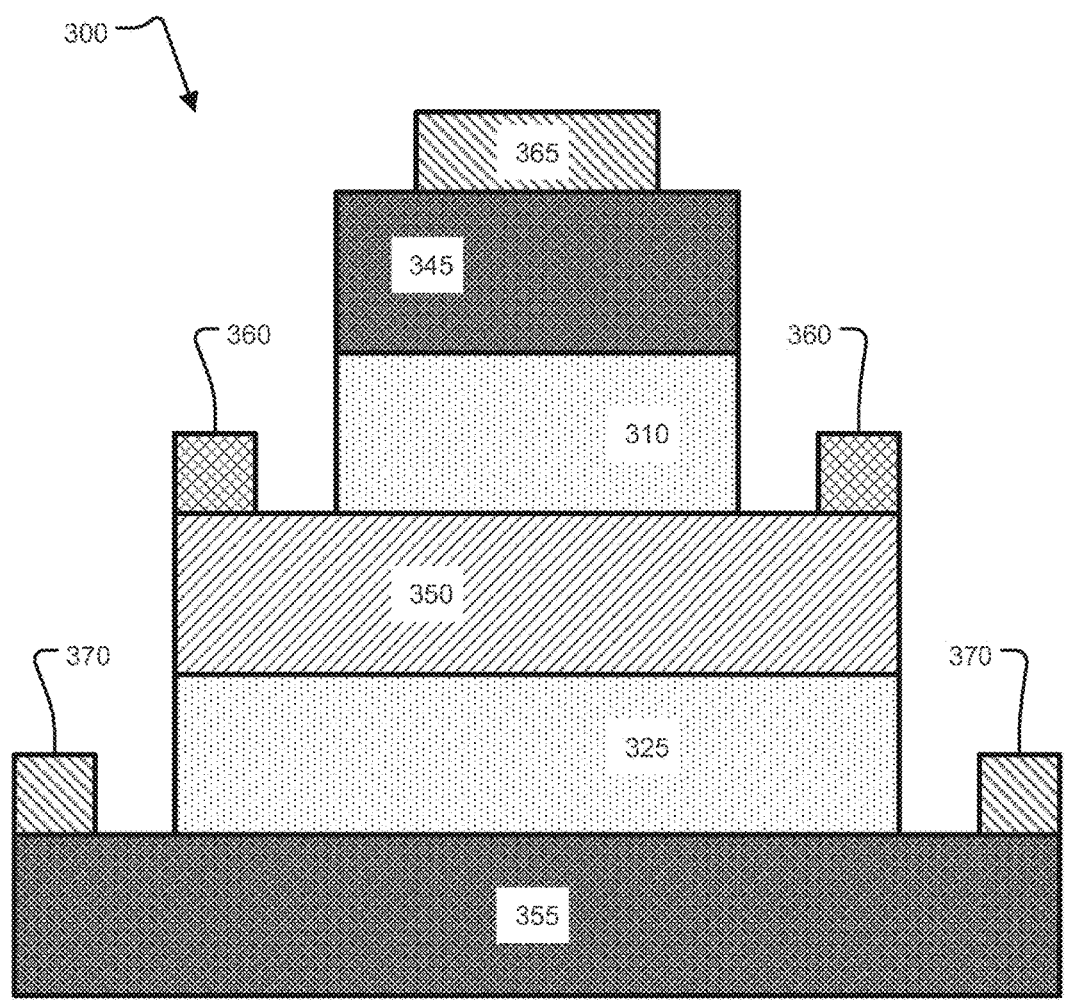
FIG. 3 illustrates an alternative general example of a dual varactor stack, in accordance with various embodiments.

FIG. 3 depicts an alternative embodiment of a varactor stack 300 that may include two varactors in a front-to-front configuration. The first varactor may include an n– varactor layer 310, a p+ anode layer 345, and an n+ contact layer 350. The n– varactor layer 310 may be similar to n– varactor layer 210 of FIG. 2. The p+ anode layer 345 may be similar to p+ anode layer 215. The n+ contact layer 350 may be similar to n+ contact layer 205. However, in the stack 300, in some embodiments the p+ anode layer 345 may have a z-height of between approximately 0.05 µm and approximately 1.0 µm, while the n+ contact layer 350 may have a z-height of between approximately 0.05 µm and approximately 0.5 µm. In specific embodiments, the z-height of the p+ anode layer 345 may be approximately 0.3 µm, while the z-height of the n+ contact layer 350 may be approximately 0.3 µm.

The stack 300 may further include a second varactor that may include the n+ contact layer 350, an n− varactor layer 325, and a p+ anode layer 355. The n-varactor layer 325 may be similar to n− varactor layer 310 discussed above. The p+ anode layer 355 may be similar top+ anode layer 345 described above. Instead of the two varactors of the stack sharing the anode layer, as discussed above with respect to stack 200 of FIG. 2, the two varactors of stack 300 may share the n+ contact layer, resulting in the face-to-face configuration described above. In some embodiments, the z-height of the n+ contact layer 350 may be less than the z-height of the p+ anode layers 345 or 355. This may be because, as discussed above, the sheet resistance of layer 350 may not significantly change the performance of the stack 300.

The stack 300 may further include n+ ohmic contacts 360, which may be similar to n+ ohmic contacts 235 or 240 discussed above. In the stack 300, ohmic contacts 360 may be coupled with the n+ contact layer 350 and configured to receive power from DC power source 125. In stack 300, the DC power source 125 may supply a positive voltage to the ohmic contacts 360, and through the ohmic contacts 360 to the n+ contact layer 350. This positive voltage may result in the voltage of the n+ contact layer 350 being higher than the voltage of the p+ anode layers 345 and/or 355. As described above, this higher voltage at the n+ contact layer 350 may result in the varactors of the stack 300 being reverse biased.

Finally, the stack 300 may additionally include one or more p+ ohmic contact such as ohmic contacts 365 and 370. Specifically, the p+ ohmic contacts 370 or 365 may be similar to the p+ ohmic contacts 220 in FIG. 2.

Figure 4:
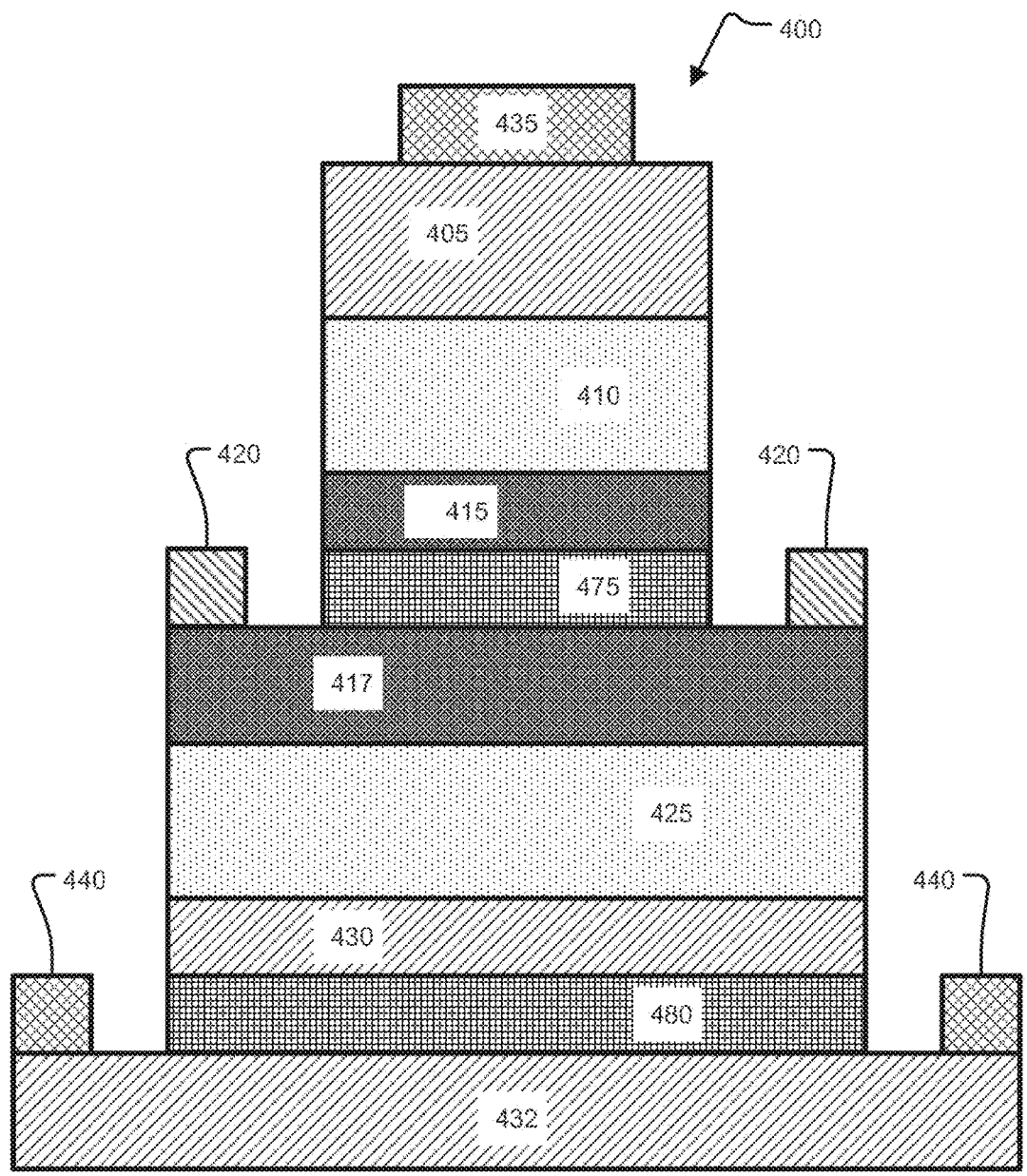
FIG. 4 illustrates a specific example of a dual varactor stack, in accordance with various embodiments.

FIG. 4 depicts a specific example of a stack 400, which may be similar to stack 200 of FIG. 2. Specifically, the stack 400 may include an n+ contact layer 405, and n− varactor layers 410 and 425, which may be respectively similar to elements 205, 210, and 225 of FIG. 2. Similarly, the stack 400 may include one or more n+ ohmic contacts such as ohmic contacts 435 and 440, and one or more p+ ohmic contacts such as ohmic contacts 420, which may be similar to ohmic contacts 235, 240, and 220, respectively.

The p+ anode contact layer may be split in stack 400, with one or more etch stop layers positioned between the two layers of the p+ anode contact layers. As shown in FIG. 4, an etch stop layer 475, which may be a p+ etch stop layer, may be positioned between the top p+ anode contact layer 415, and the bottom p+ anode contact layer 417. Similarly, a bottom n+ contact layer may be split into two separate layers, with one or more etch stop layers such as n+ etch stop layers positioned therebetween. For example, in stack 400 the n+ contact layer may be split into an upper n+ contact layer 430, and a lower n+ contact layer 432. Etch stop layer 480 may be positioned between the two layers of the n+ contact layer.

In embodiments, one or more of the contact layers 405, 430, and 432; the varactor layers 410 and 425; and the anode contact layers 415 and 417 may be comprised of doped gallium arsenide. In embodiments, the etch stop layers 475 and 480 may be comprised of doped aluminum gallium arsenide or indium gallium phosphide.

Figure 5:
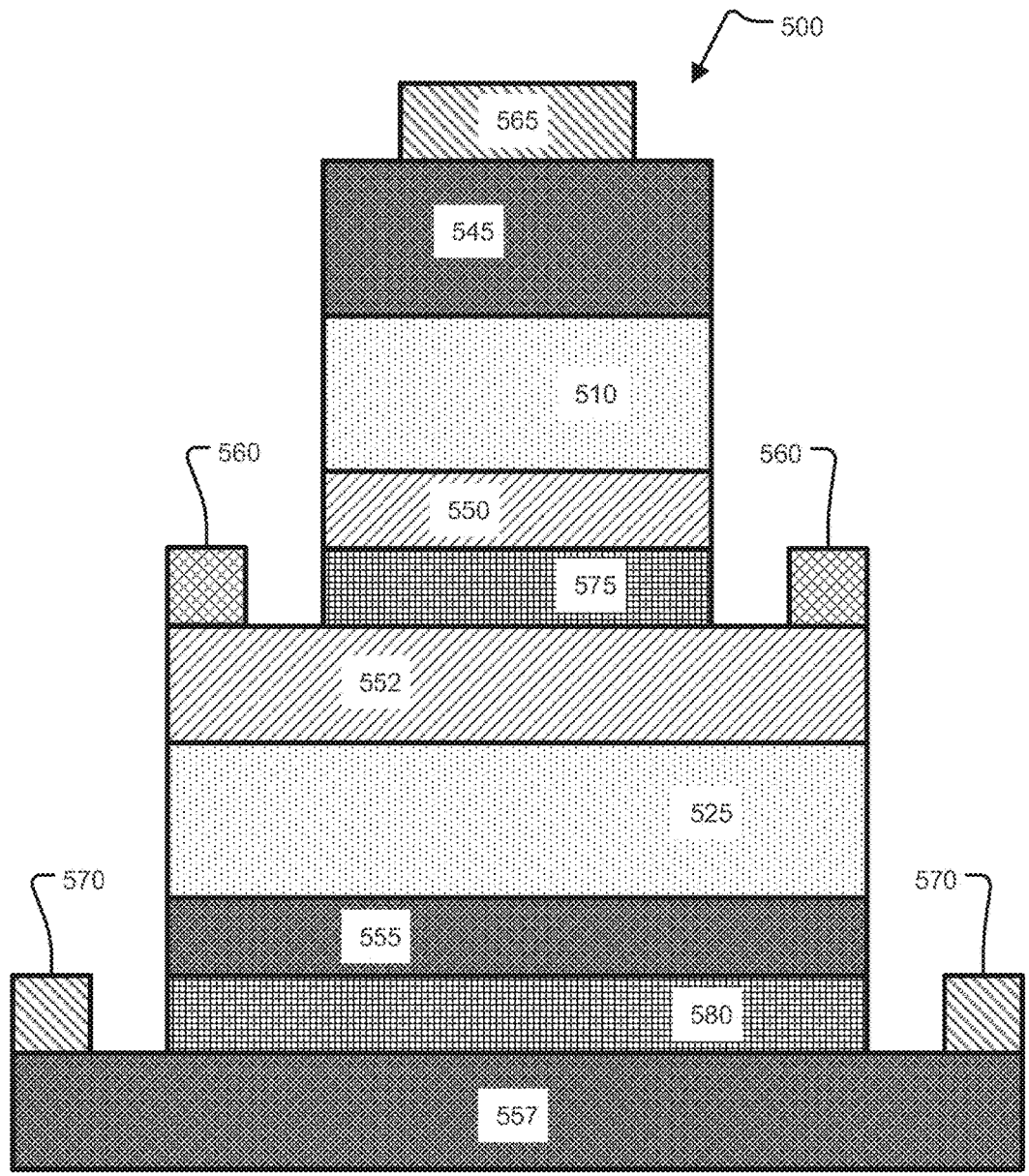
FIG. 5 illustrates an alternative specific example of a dual varactor stack, in accordance with various embodiments.

FIG. 5 depicts a specific example of a stack 500, which may be similar to stack 300 of FIG. 3. Specifically, the stack 500 may include a p+ anode layer 545 and n− varactor layers 510 and 525, which may be respectively similar to elements 345, 310, and 325 of FIG. 3. Similarly, the stack 500 may include one or more n+ ohmic contacts 560, and p+ ohmic contacts 565 or 570, which may be respectively similar to ohmic contacts 360, 365, and 370 of FIG. 3.

The n+ contact layer may be split into two separate layers with an etch stop layer such as an n+ etch stop layer positioned therebetween. As shown in FIG. 5, stack 500 may include a top n+ contact layer 550, and a bottom n+ contact layer 552, with etch stop layer 575 positioned therebetween. Etch stop layer 575 may be similar to etch stop layer 475 of FIG. 4.

Similarly, a bottom p+ anode layer of stack 500 may be split into two separate layers, with an etch stop layer such as a p+ etch stop layer positioned therebetween. Specifically, the p+ anode layer may be split into a top p+ anode layer 555, and a bottom p+ anode layer 557, with etch stop layer 580 positioned therebetween. Etch stop layer 580 may be similar to etch stop layer 480 of FIG. 4.

In embodiments, one or more of the contact layers 550 and 552; the varactor layers 525 and 510; and the anode layers 545, 555, and 557 may be comprised of gallium arsenide.

Figure 6:
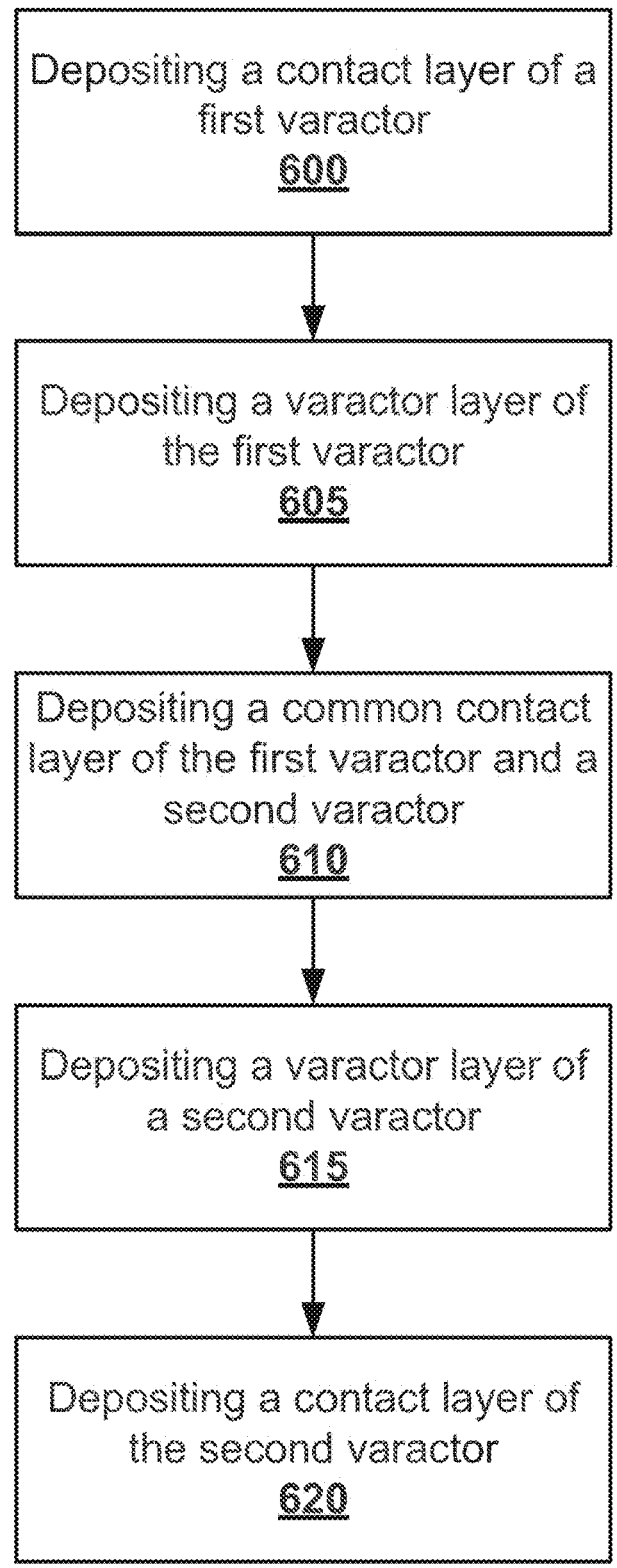
FIG. 6 illustrates a process for constructing a dual varactor stack, in accordance with various embodiments.

FIG. 6 depicts an example method for forming a stack such as stacks 200, 300, 400, or 500. Specifically, a contact layer of a first varactor may be deposited at 600. The contact layer may be, for example, p+ anode layers 355, 555, 557. Alternatively, the contact layer may be, for example, n+ contact layers 230, 430, or 432. Specifically, the type of contact layer may be selected based on whether stack 200, 300, 400, or 500 is being constructed. In some embodiments, the deposition of the contact layer may include deposition of an etch stop layer such as etch stop layers 480 or 580.

Next, a varactor layer of the first varactor may be deposited at 605. Specifically, the varactor layer may be an n− varactor layer such as layers 225, 325, 425, or 525. After depositing the varactor layer, the process may involve depositing a common contact layer of the first varactor and a second varactor at 610. The common contact layer may be, for example p+ anode layers 215, 415, or 417. Alternatively, the common contact layer may be n+ contact layers 350, 550, or 552. Specifically, the common contact layer may be selected based on whether stacks 200, 300, 400, or 500 are being constructed. In some embodiments, deposition of the common contact layer may involve deposition of an etch stop layer such as etch stop layers 475 or 575.

Subsequent to deposition of the common contact layers at 610, the process may next involve depositing a varactor layer of a second varactor layer at 615. Specifically, the second varactor layer may be an n− varactor layer such as layers 210, 310, 410, or 510. Finally, the process may involve depositing a contact layer of the second varactor at 620. Specifically, the contact layer may be an n+ contact layer such as layers 205 or 405. In other embodiments, the second contact layer may be a p+ anode layer such as layers 345 or 545. Specifically, the type of contact layer may be selected based on whether stack 200, 300, 400, or 500 is being constructed.

In some embodiments, the process may involve additional or alternative steps. For example, in some embodiments, ohmic contacts may be deposited onto the stack. In other embodiments, one or more of the layers may be deposited in an order that is different from the order illustrated in FIG. 6. For example, in some embodiments two layers may be deposited in parallel with one another.

Figure 7:
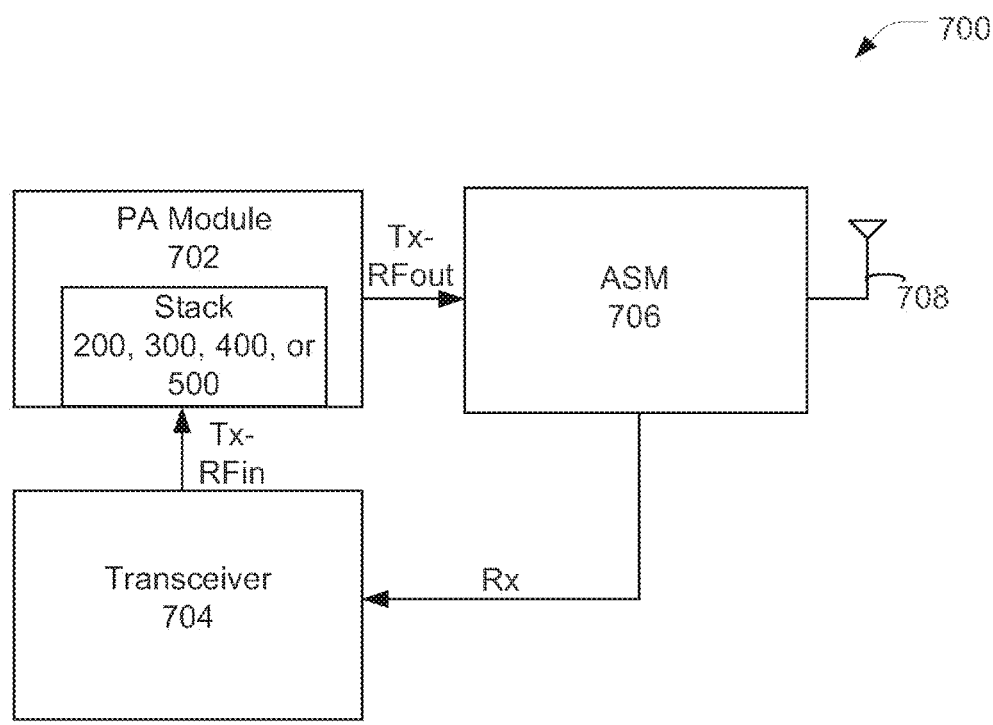
FIG. 7 is a block diagram of an exemplary wireless communication device, in accordance with various embodiments.

Stacks 200, 300, 400, or 500 may be incorporated into a variety of systems. A block diagram of an example system 700 is illustrated in FIG. 7. As illustrated, the system 700 includes a power amplifier (PA) module 702, which may be a radio frequency (RF) PA module in some embodiments. The system 700 may include a transceiver 704 coupled with the PA module 702 as illustrated. The PA module 702 may include one or more of stacks 200, 300, 400, or 500. In various embodiments, the stacks 200, 300, 400, or 500 may additionally/alternatively be included in the transceiver 704 to provide, e.g., up-converting, or in an antenna switch module (ASM) 706 to provide various switching functions.

The PA module 702 may receive an RF input signal, RFin, from the transceiver 704. The PA module 702 may amplify the RF input signal, RFin, to provide the RF output signal, RFout. The RF input signal, RFin, and the RF output signal, RFout, may both be part of a transmit chain, respectively noted by Tx-RFin and Tx-RFout in FIG. 7.

The amplified RF output signal, RFout, may be provided to the ASM 706, which effectuates an over-the-air (OTA) transmission of the RF output signal, RFout, via an antenna structure 708. The ASM 706 may also receive RF signals via the antenna structure 708 and couple the received RF signals, Rx, to the transceiver 704 along a receive chain.

In various embodiments, the antenna structure 708 may include one or more directional and/or omnidirectional antennas, including, e.g., a dipole antenna, a monopole antenna, a patch antenna, a loop antenna, a microstrip antenna or any other type of antenna suitable for OTA transmission/reception of RF signals.

The system 700 may be suitable for any one or more of terrestrial and satellite communications, radar systems, and possibly in various industrial and medical applications. More specifically, in various embodiments, the system 700 may be a selected one of a radar device, a satellite communication device, a mobile computing device (e.g., a phone, a tablet, a laptop, etc.), a base station, a broadcast radio, or a television amplifier system.

Although the present disclosure has been described in terms of the above-illustrated embodiments, it will be appreciated by those of ordinary skill in the art that a wide variety of alternate and/or equivalent implementations calculated to achieve the same purposes may be substituted for the specific embodiments shown and described without departing from the scope of the present disclosure. Those with skill in the art will readily appreciate that the teachings of the present disclosure may be implemented in a wide variety of embodiments. This description is intended to be regarded as illustrative instead of restrictive.

What is claimed is:

1. A package comprising:
    a first varactor comprising a first contact layer, an anode layer, and a first varactor layer between the first contact layer and the anode layer; and
    a second varactor over the first varactor and comprising a second contact layer, the anode layer, and a second varactor layer between the second contact layer and the anode layer, wherein:
    the anode layer is between the first varactor layer and the second varactor layer; and
    the anode layer comprises a first anode contact layer coupled with the first varactor layer, and a second anode contact layer coupled with the second varactor layer, and a first etch stop layer between and coupled with the first anode contact layer and the second anode contact layer, and wherein:
    the first contact layer comprises a top layer directly coupled with the first varactor layer, a bottom layer, and a second etch stop layer coupled between the top layer and the bottom layer, wherein the top layer and the bottom layer of the first contact layer comprise doped gallium arsenide and the second etch stop layer comprises one of doped aluminum gallium arsenide or indium gallium phosphide.

2. The package of claim 1, further comprising an ohmic contact coupled with the anode layer and configured to receive a negative direct current (DC) voltage.

3. The package of claim 1, further comprising a first ohmic contact coupled with the first contact layer, and a second ohmic contact coupled with the second contact layer.

4. The package of claim 3, wherein the first ohmic contact is a signal input, and the second ohmic contact is a signal output.

5. The package of claim 1, wherein the first contact layer or the second contact layer is n+ doped, the first varactor layer or the second varactor layer is n− doped, and the anode layer is p+ doped.

6. The package of claim 1, wherein the anode layer comprises at least one of gallium arsenide, germanium, aluminum phosphide, aluminum arsenide, indium phosphide, and gallium nitride.

7. A method comprising:
    depositing a first contact layer of a first varactor;
    depositing a first varactor layer of the first varactor on the first contact layer; depositing a common contact layer of the first varactor and a second varactor on the first varactor layer;
    depositing a second varactor layer of the second varactor on the common contact layer; and
    depositing a second contact layer of the second varactor on the second varactor layer, wherein:
    the first varactor layer has a first doping profile such that a doping concentration of the first varactor layer varies over a is a function of depth of the first varactor layer;
    the second varactor layer has a second doping profile such that a doping concentration of the second varactor layer varies over a is a function of depth of the second varactor layer;
    the second doping profile is inverted with respect to the first doping profile; and
    the common contact layer comprises a first common contact layer coupled with the first varactor layer, and a second common contact layer coupled with the second varactor layer, and a first etch stop layer between and coupled with the first common contact layer and the second common contact layer, and wherein:
    the first contact layer comprises a top layer directly coupled with the first varactor layer, a bottom layer, and a second etch stop layer coupled between the top layer and the bottom layer, wherein the top layer and the bottom layer of the first contact layer comprises doped gallium arsenide and the second etch stop layer comprises one of doped aluminum gallium arsenide or indium gallium phosphide.

8. The method of claim 7, wherein the common contact layer is a p+ doped anode contact layer and the first contact layer and the second contact layer are n+ doped contact layers.

9. The method of claim 7, wherein the first doping profile and the second doping profile are both linear doping profiles.

10. The method of claim 7, wherein the first doping profile and the second doping profile are both abrupt doping profiles.

11. The method of claim 7, wherein the first doping profile and the second doping profile are both hyper-abrupt doping profiles.

12. A package comprising:
a first varactor comprising a first contact layer, a common contact layer, and a first varactor layer between the first contact layer and the common contact layer; and
a second varactor over the first varactor and comprising a second contact layer, the common contact layer, and a second varactor layer between the second contact layer and the common contact layer; wherein:
the common contact layer is between the first varactor layer and the second varactor layer;
the first varactor layer has a first doping profile such that a doping concentration of the first varactor layer varies over a is a function of depth of the first varactor layer;
the second varactor layer has a second doping profile such that a doping concentration of the second varactor layer varies over a is a function of depth of the second varactor layer;
the second doping profile is inverted with respect to the first doping profile; and
the common contact layer comprises a first common contact layer coupled with the first varactor layer, and a second common contact layer coupled with the second varactor layer, and a first etch stop layer between and coupled with the first common contact layer and the second common contact layer, and wherein:
the first contact layer comprises a top layer directly coupled with the first varactor layer, a bottom layer, and a second etch stop layer coupled between the top layer and the bottom layer, wherein the top layer and the bottom layer of the first contact layer comprises doped gallium arsenide and the second etch stop layer comprises one of doped aluminum gallium arsenide or indium gallium phosphide.

13. The package of claim 12, wherein the common contact layer comprises at least one of gallium arsenide, germanium, aluminum phosphide, aluminum arsenide, indium phosphide, and gallium nitride.

14. The package of claim 12, wherein the common contact layer is a p+ doped anode contact layer and the first contact layer and the second contact layer are n+ doped contact layers.

15. The package of claim 14, further comprising an ohmic contact coupled with the common contact layer and configured to receive a negative direct current (DC) voltage.

16. The package of claim 12, wherein the first doping profile and the second doping profile are both linear doping profiles.

17. The package of claim 12, wherein the first doping profile and the second doping profile are both abrupt doping profiles.

18. The package of claim 12, wherein the first doping profile and the second doping profile are both hyper-abrupt doping profiles.

* * * * *

UNITED STATES PATENT AND TRADEMARK OFFICE
CERTIFICATE OF CORRECTION

PATENT NO. : 10,535,784 B2
APPLICATION NO. : 15/901061
DATED : January 14, 2020
INVENTOR(S) : Peter V. Wright and Timothy S. Henderson Page 1 of 1

It is certified that error appears in the above-identified patent and that said Letters Patent is hereby corrected as shown below:

In the Claims

Column 10 In Claim 7, Lines 40-41, replace "a doping concentration of the first varactor layer varies over a is a function of depth of the first varactor layer" with --a doping concentration of the first varactor layer is a function of depth of the first varactor layer--.
Column 10 In Claim 7, Lines 43-45, replace "a doping concentration of the second varactor layer varies over a is a function of depth of the second varactor layer" with --a doping concentration of the second varactor layer is a function of depth of the second varactor layer--.
Column 11 In Claim 12, Lines 18-19, replace "a doping concentration of the first varactor layer varies over a is a function of depth of the first varactor layer" with --a doping concentration of the first varactor layer is a function of depth of the first varactor layer--.
Column 11 In Claim 12, Lines 21-23, replace "a doping concentration of the second varactor layer varies over a is a function of depth of the second varactor layer" with --a doping concentration of the second varactor layer is a function of depth of the second varactor layer--.

Signed and Sealed this
Twenty-fifth Day of February, 2020

Andrei Iancu
*Director of the United States Patent and Trademark Office*